United States Patent
Hayashi et al.

[11] Patent Number: 5,663,892
[45] Date of Patent: Sep. 2, 1997

[54] METHOD OF COMPACTING LAYOUTS OF SEMICONDUCTOR INTEGRATED CIRCUIT DESIGNED IN A HIERARCHY

[75] Inventors: Sachio Hayashi, Saitama-ken; Tyusei Ogawa, Iwate-ken, both of Japan

[73] Assignee: Kabushiki Kaisha Toshiba, Kawasaki, Japan

[21] Appl. No.: 412,503

[22] Filed: Mar. 29, 1995

[30] Foreign Application Priority Data

Mar. 29, 1994 [JP] Japan .................. 6-058469

[51] Int. Cl.⁶ .................................. G06F 17/50
[52] U.S. Cl. .................. 364/491; 364/488; 364/490
[58] Field of Search .................. 364/488, 489, 364/490, 491, 578; 437/250

[56] References Cited

U.S. PATENT DOCUMENTS

| | | | |
|---|---|---|---|
| 4,612,618 | 9/1986 | Pryor et al. | 364/490 |
| 4,954,953 | 9/1990 | Bush | 364/578 |
| 5,050,091 | 9/1991 | Rubin | 364/488 |
| 5,097,422 | 3/1992 | Corbin, II et al. | 364/491 |
| 5,119,313 | 6/1992 | Shaw et al. | 364/491 |
| 5,281,558 | 1/1994 | Bamji et al. | 437/250 |
| 5,303,161 | 4/1994 | Burns et al. | 364/490 |
| 5,309,371 | 5/1994 | Shikata et al. | 364/491 |
| 5,381,343 | 1/1995 | Bamji et al. | 364/488 |
| 5,416,722 | 5/1995 | Edwards | 364/491 |
| 5,461,577 | 10/1995 | Shaw et al. | 364/491 |

*Primary Examiner*—Kevin J. Teska
*Assistant Examiner*—Russell W. Frejd
*Attorney, Agent, or Firm*—Foley & Lardner

[57] ABSTRACT

A method for performing compaction of a layout of a semiconductor integrated circuit designed in a hierarchy is described. The compaction of the layout is carried out by repeating a single level compaction process for compacting cell layouts in one of the hierarchical levels from a lowest level to a highest level of the hierarchical levels. The single level compaction process comprises a first replacement step of replacing lower level cell layouts in a current level cell layout with abstract cell layouts having the same profile and the same positions of terminals to be connected to the current level cell layout as the lower level cell layouts have in advance of compaction. The compaction of the current level cell is performed under a constraint that the relocations of the terminals of the current level cell layout after compaction from the original positions before compaction are possible within prescribed ranges. After compaction, the abstract cell layouts is replaced by the lower level cell layouts.

4 Claims, 6 Drawing Sheets

METHOD OF COMPACTING LAYOUTS OF SEMICONDUCTOR INTEGRATED CIRCUIT DESIGNED IN A HIERARCHY

BACKGROUND OF THE INVENTION

1. Field of the Invention

The present invention relates to a method of compacting layouts (mask patterns) of semiconductor integrated circuits. Particularly, the present invention relates to an improvement of the compaction procedure for compacting hierarchically arranged layouts.

2. Description of the Prior Art

A layout of a semiconductor integrated circuit generally consists of a plurality of lower level cell layouts and higher level cell layouts in a hierarchical structure. These lower level cell layouts and higher level cell layouts are coupled by wirings in interconnection areas designed together with the layout of the higher level cell layouts. In accordance with one approach to perform compaction of such layouts composed of a plurality of lower level cell layouts and higher level cell layouts in a hierarchical structure, all the lower level cell layouts are expanded to flatten the hierarchy into a single level layout followed by compaction of the single level layout. However, a usual compactor implemented with a standard EWS (engineering workstation) can deal only with semiconductor integrated circuits composed of up to about ten thousands transistors. More comprehensive semiconductor integrated circuits designed in higher integration levels can therefore not be compacted by this method.

Several approaches have been proposed to perform compaction of hierarchical layouts without resolving the hierarchy.

These approaches include the bottom-up method and the pitch-matching method. In accordance with the bottom-up method, the compaction is performed in sequence from the lowest level cell layouts to the highest level cell layouts. The interconnection between lower level cell layouts and higher level cell layouts is made by the river routing technique after compaction. In accordance with the river routing technique, single layered wirings are used to interconnect corresponding terminals of lower level cell layouts and higher level cell layouts arranged in the same order without intersection.

On the other hand, in accordance with the pitch-matching method, compaction is performed in order to maintain agreement of the positions of the terminals of lower level cell layouts with the positions of the corresponding terminals of higher level cell layouts at the boundaries between the lower level cell layouts and the higher level cell layouts. In this case, particular interconnection procedure is not needed after the compaction.

However, in accordance with the bottom-up method, when interconnection is made between lower level cell layouts and a higher level cell layout in accordance with the bottom-up method, since the terminals of the lower level cell layouts tend to depart from the corresponding terminals of the higher level cell layouts by compaction, the interconnection areas are therefore increased to make connection therebetween. Accordingly, the compaction ratio can not fully be reflected to the reduction of the chip size.

Contrary to this, in accordance with the pitch-matching method, the increase of the chip size due to the interconnection areas is avoided since the spatial correspondence between terminals of lower level cell layouts and higher level cell layouts is maintained just after compaction. However, this method is applicable only to the cases where there is some regularity between lower level cell layouts and higher level cell layouts.

The accompanying drawings, which are incorporated in and form a part of the invention and, together with the description, serve to explain the principles of the invention.

SUMMARY OF THE INVENTION

It is an object of the present invention to provide an improvement of a method for performing compaction of a layout of a semiconductor integrated circuit designed in a hierarchy.

It is an object of the present invention to provide a method for performing compaction of a layout of a semiconductor integrated circuit designed in a hierarchy in which the compaction ratio can fully be reflected to the reduction of the chip size by reducing interconnection areas necessary to make connection among cell layouts in different hierarchical levels.

It is an object of the present invention to provide a method for performing compaction of a layout of a semiconductor integrated circuit designed in a hierarchy with no or limited relocation of the terminals of the respective cell layouts one level lower than the current level cell from the original positions so that there are needed only narrow interconnection areas for making connection between lower level cell layouts and highest level cell layouts.

It is an object of the present invention to provide a method for performing compaction of a layout of a semiconductor integrated circuit designed in a hierarchy having broad applicability.

To achieve the foregoing and other object, and in accordance with the present invention, as embodied and broadly described herein, a method for performing compaction of a layout of a semiconductor integrated circuit designed in a hierarchy, the layout being composed of cell layouts, each cell layout being designed in one of a plurality of hierarchical levels, the method being capable of performing compaction of the layout of the semiconductor integrated circuit by repeating a single level compaction process for compacting cell layouts in one of the hierarchical levels from a lowest level to a highest level of the hierarchical levels, the single level compaction process comprising:

a first replacement step of replacing lower level cell layouts having been compacted in the single level compaction process in a hierarchical level one level lower than that of a current level cell layout with abstract cell layouts, the abstract cell layouts having the same profile and the same positions of terminals to be connected to the current level cell layout as the lower level cell layouts have in advance of compaction;

a compaction constraint imposition step for imposing compaction constraints on a compactor, the compaction constraints including a constraint that the relocations of the terminals of the current level cell layout after compaction from the original positions before compaction are possible within prescribed ranges;

a compaction step of compacting the current level cell layout by means of the compactor under the compaction constraints; and a second replacement step of replacing the abstract cell layouts with the lower level cell layouts having been compacted.

The compaction constraints preferably further includes a constraint that the dimensions of the terminals and the positions of the abstract cell layout are equal to those of the lower level cell layouts after compaction.

Also, the compaction constraints preferably further including a constraint that the interconnection between the terminals of the abstract cell layout and the current level cell layout is maintained after compaction.

Furthermore, the method for performing compaction further comprises a river-routing step of connecting the terminals of the abstract cell layout with the current level cell layout is carried out by means of single layered wirings when the interconnection between the terminals of the abstract cell layout and the current level cell layout is not maintained after compaction.

In accordance with another aspect of the present invention, a method for performing compaction of a layout of a semiconductor integrated circuit designed in a hierarchy, the layout being composed of cell layouts, each cell layout being designed in one of a plurality of hierarchical levels, the method being capable of performing compaction of the layout of the semiconductor integrated circuit by repeating a single level compaction process for compacting cell layouts in one of the hierarchical levels from a lowest level to a highest level of the hierarchical levels, the single level compaction process comprising:

a first replacement step of replacing lower level cell layouts having been compacted in the single level compaction process in a hierarchical level one level lower than that of a current level cell layout with abstract cell layouts, the abstract cell layouts having the same profile and the same positions of terminals to be connected to the current level cell layout as the lower level cell layouts have after compaction;

a river-routing step of connecting the terminals of the abstract cell layout with the current level cell layout by means of single layered wirings;

a compaction constraint imposition step for imposing compaction constraints on a compactor, the compaction constraints including a constraint that the relocations of the terminals of the current level cell layout after compaction from the original positions before compaction are possible within prescribed ranges;

a compaction step of compacting the current level cell layout by means of the compactor under the compaction constraints; and a second replacement step of replacing the abstract cell layouts with the lower level cell layouts having been compacted.

The accompanying drawings, which are incorporated in and form a part of the invention and, together with the description, serve to explain the principles of the invention.

DETAILED DESCRIPTION OF EMBODIMENTS

Figure 1:
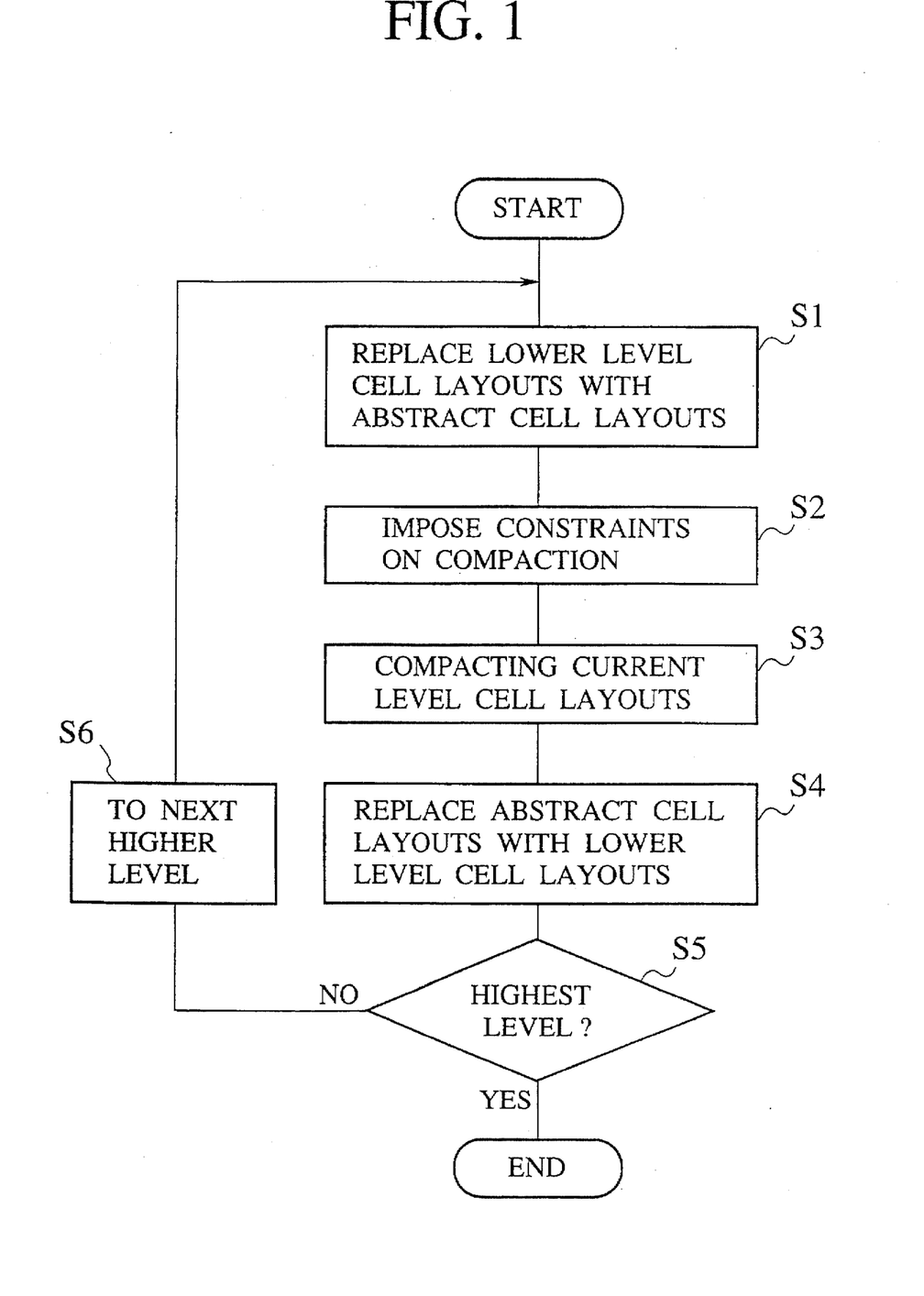
FIG. 1 is a flow chart showing a method of compacting layouts of semiconductor integrated circuit in accordance with an embodiment of the present invention.
Figure 2:
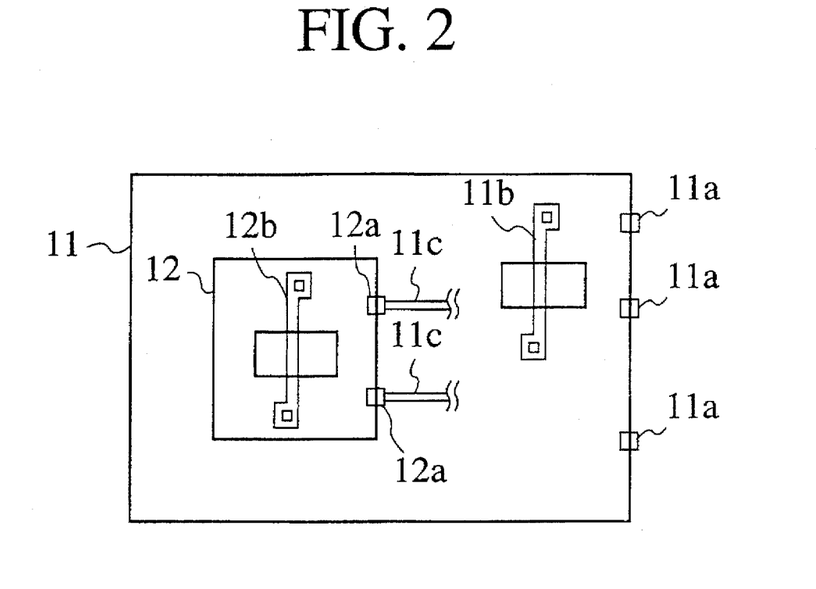
FIG. 2 is a schematic diagram showing a current level cell layout and a lower level cell layout involved in the current level cell layout in the layout hierarchy in accordance with the embodiment of the present invention.

Referring now to the accompanying drawings, the method of compacting layouts of semiconductor integrated circuits in accordance with the present invention will be described. FIG. 1 is a flow chart showing a method of compacting layouts of a semiconductor integrated circuit in accordance with an embodiment of the present invention. FIG. 2 is a schematic diagram showing a current level cell layout and a lower level cell layout in the layout hierarchy.

In FIG. 2, numeral 11 designates a cell layout in a certain level of the layout hierarchy and numeral 12 designates a cell layout one level lower than the cell layout 11. The current level cell layout 11 includes a cell layout pattern 11b and terminals 11a with which the cell layout 11 can be connected with a cell layout one level higher than the cell layout 11. The lower level cell layout 12 includes a cell layout pattern 12b and terminals 12a with which the cell layout 12 can be connected with the current level cell layout 11. The current level cell layout 11 also includes wirings 11c for making connection with the terminals 12a of the lower level cell layout 12.

Figure 3A:
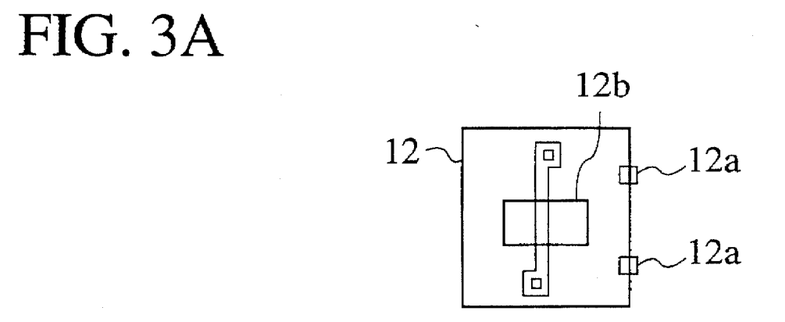
FIG. 3(A) is a schematic diagram showing the lower level cell layout 12 in advance of compaction.
Figure 3B:
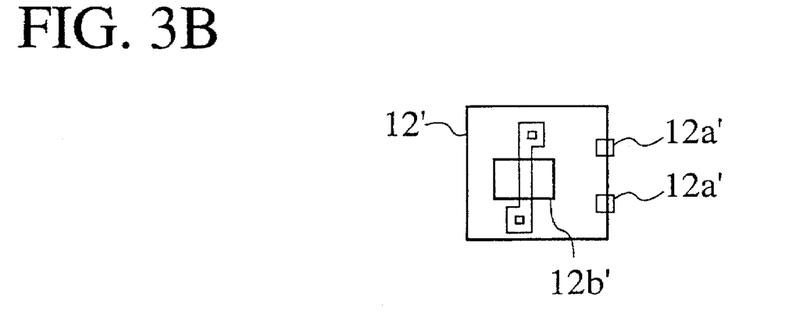
FIG. 3(B) is a schematic diagram showing the lower level cell layout 12 after the compaction.

Since the compaction is made from lower level cell layouts to higher level cell layouts in order, it can be assumed that the lower level dell layout 12 has already been compacted as illustrated in FIGS. 3(A) and 3(B). FIG. 3(A) is a schematic diagram showing the lower level cell layout 12 in advance of compaction. FIG. 3(B) is a schematic diagram showing the lower level cell layout 12 after the compaction.

For making clear the correspondence, the reference numerals attached to the lower level cell layout after the compaction are given apostrophes to distinguish each elements from those of the lower level cell layout 12 in advance of compaction.

Figure 4:
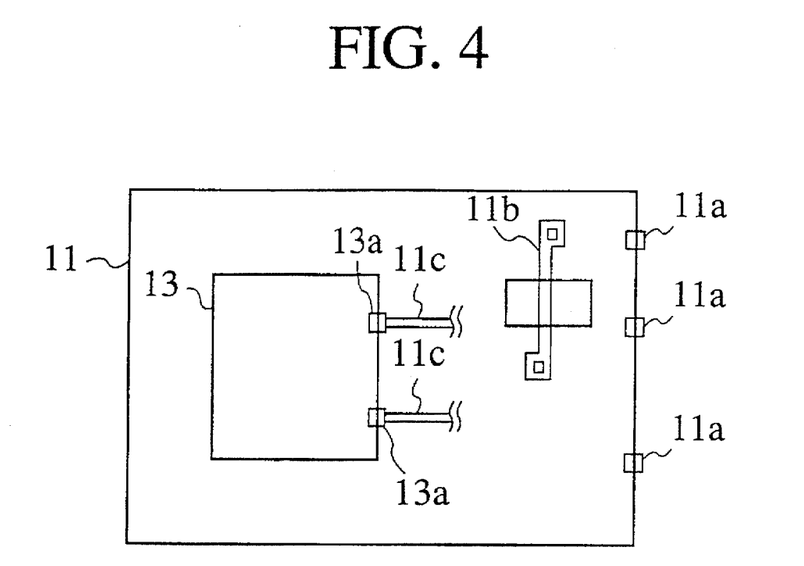
FIG. 4 is a schematic diagram showing the current level cell layout in which a lower level cell layout involved in the current level cell layout is replaced by an abstract cell layout in accordance with the embodiment of the present invention.

First, the lower level cell layout 12 are replaced with an abstract cell layout in the current level cell layout 11 in Step S1. The abstract cell layout is readily introduced to represent the lower level cell layout 12 only with respect to the position of the terminals and the peripheral configuration of the lower level cell layout 12. In other words, the abstract cell layout is a dummy cell having only a profile and dummy terminals but no circuit elements therein. The dimensions and the positions of the terminals of the abstract cell layout are identical to those of the lower level cell layout 12 before compaction at this time. It is therefore possible to make interconnection between the current level cell layout 11 and the lower level cell layout 12 by means of the wirings 11c and the terminals 12a without modification. FIG. 4 is a schematic diagram showing the interconnection between the current level cell layout 11 and the abstract cell layout 13 by means of the wirings 11c of the current level cell 11 and the terminals 13a of the abstract cell layout 13

Several compaction constraints are imposed on a compactor in Step S2 in advance of actual compaction by the compactor as follows.

(1) The positions of the terminals and the dimensions of the abstract cell layout 13 are identical to those of the lower level cell layout 12' after compaction.

(2) The interconnection between the terminals 13a of the abstract cell layout 13 and the wirings 11c of the current level cell layout 11 is maintained also after compaction. In other words, the distances between the terminals 13a of the abstract cell layout 13 and the contact points of the wirings 11c of the current level cell layout 11 are zeros after compaction.

(3) The relocations of the terminals 11a of the current level cell layout 11 after compaction from the original positions are allowed within prescribed ranges.

The compaction constraint (3) is introduced for the purpose of making it possible to satisfy the compaction constraint (2) when compacting a cell layout one level higher than the current level cell layout 11. Namely, if the positions of the terminals 11a of the current level cell layout 11 are substantially moved, the interconnection between the terminals of the abstract cell layout representing the current level cell layout 11 and the wirings of the next higher level cell layouts to be connected can no longer be maintained.

Figure 5:
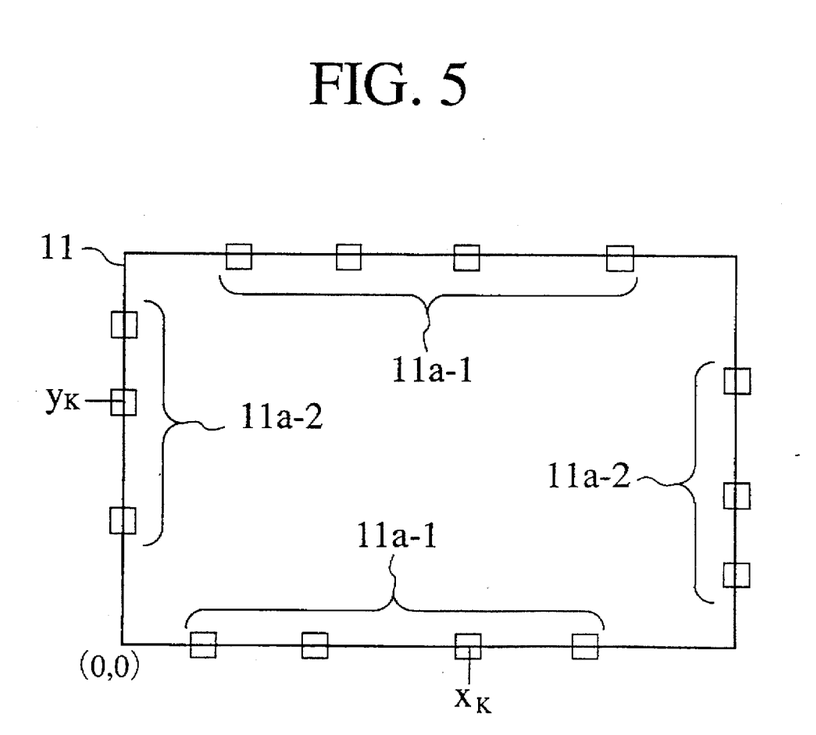
FIG. 5 is a schematic diagram showing an example of determining the compaction constraint in accordance with the embodiment of the present invention.

Next, an example of determining the compaction constraint (3) in accordance with the present embodiment will be described hereinbelow with reference to FIG. 5. The positions of the terminals 11a of the current level cell layout 11 are given coordinates with the lower left corner of the current level cell layout 11 as an origin (0,0).

When the current level cell layout 11 is compacted in the X-direction (the right and left direction), the terminals 11a-1 arranged on the upper and lower sides of the current level cell layout 11 are relocated from the original positions Xk before compaction to new positions Xk' after compaction. In this case, the compaction constraint imposed is expressed by the following formula $$a \cdot Xk \leq Xk' \leq b \cdot Xk$$

where the actual values "a" and "b" are appropriately selected by a designer in accordance with the case taking into account the compaction ratio.

For example, when the current level cell layout 11 is compacted proportionally in the X-direction by 10%, the terminal 11a located in Xk before compaction is expected to be relocated in the vicinity of 0.9 Xk after compaction. The actual values "a" and "b" may therefore be selected to be, e.g., a=0.85 and b=1.05.

In the same manner, when the current level cell layout 11 is compacted in the Y-direction (the vertical direction), the terminals 11a-2 arranged on the right and left sides of the current level cell layout 11 are relocated from the original positions Yk before compaction to new positions Yk' after compaction. In this case, the compaction constraint imposed is expressed by the following formula $$c \cdot Yk \leq Yk' \leq d \cdot Yk$$

The actual values "c" and "d" are also selected by a designer in accordance with the case taking into account the compaction ratio in the same manner as the values "a" and "b" in the case of the X-direction.

After adding the compaction constraints to the compactor as described in the above (1) to (3), the current level cell layout 11 is compacted in Step S3. Of course, since usually there are a number of other cell layouts in the same level as the current level cell layout 11, Steps S1 to S3 are carried out for all the cell layouts in the same level while only one current level cell layout is illustrated for simplification.

The compaction of the layout of the current level cell layout 11 is then completed by replacing the abstract cell layout 13 with the lower level cell layout 12' which has been already compacted, followed by in Step S5. Needless to say, although only one lower level cell layout is described for the purpose of explanation, one current level cell layout usually contains a number of lower level cell layouts therein.

In Step S5, it is judged whether or not the current level cell layout 11 is a highest level cell layout of the semiconductor integrated circuit. If the current level cell layout 11 is a highest level cell layout, the compaction process is completed. If the current level cell layout 11 is not a highest level cell layout, the processes in Steps S1 to S6 are repeated for cell layouts one level higher than the current level cell layout 11.

In this manner, the compaction of the layout of a semiconductor integrated circuit designed in a hierarchy can be carried out in order by sequentially performing compaction from the lowest level cell layouts to the highest level cell layouts in accordance with Steps S1 to S4.

In accordance with the above embodiment, when compaction constraints are too strict, the wirings 11c of the current level cell layout 11 to be connected with the terminals 12a of the lower level cell layout 12 can no longer keep with the correspondence with the actual positions of the terminals 12a of the lower level cell layout 12 after compaction. In such an over-constrained case, the river-routing technique can be utilized to recover the connection.

Figure 6:
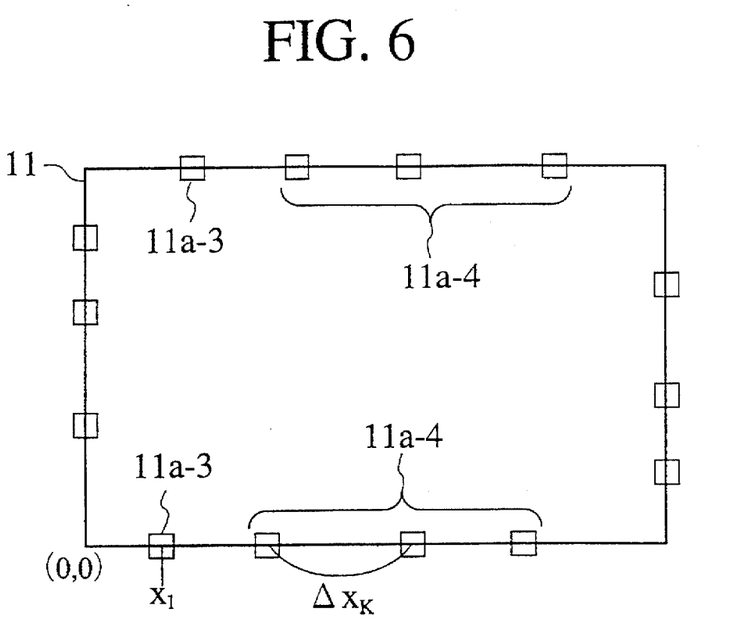
FIG. 6 is a schematic diagram showing another example of determining the compaction constraint in accordance with the embodiment of the present invention.

Next, another example of determining the compaction constraint (3) in accordance with the present embodiment of the present invention will be described hereinbelow with reference to FIG. 6.

When the current level cell layout 11 is compacted in the X-direction, the terminals 11a-3 which are leftmost terminals of those arranged on the upper and lower sides of the current level cell layout 11 are relocated from the original positions X1 before compaction to new positions X1' after compaction. In this case, the compaction constraint imposed is expressed by the following formula $$e \cdot X1 \leq X1' \leq f \cdot X1$$

where the actual values "d" and "f" are appropriately selected by a designer in accordance with the case taking into account the compaction ratio.

For other terminals arranged on the upper and lower sides of the current level cell layout 11, compaction constraints are given as follows.

$$e \cdot \Delta Xk \leq \Delta Xk' \leq f \cdot \Delta Xk$$

where the distance between each adjacent terminals vary from the original distance $\Delta Xk$ before compaction to new distance $\Delta Xk'$ after compaction.

When compaction is performed in the Y-direction, similar compaction constraints are given to the terminals arranged on the right and left sides of the current level cell layout 11.

In the previous example described with reference to FIG. 5, terminals which are closely located to each other in original positions may possibly be exchanged. However, the relationship of adjacent terminals is always maintained in this case.

Figure 7:
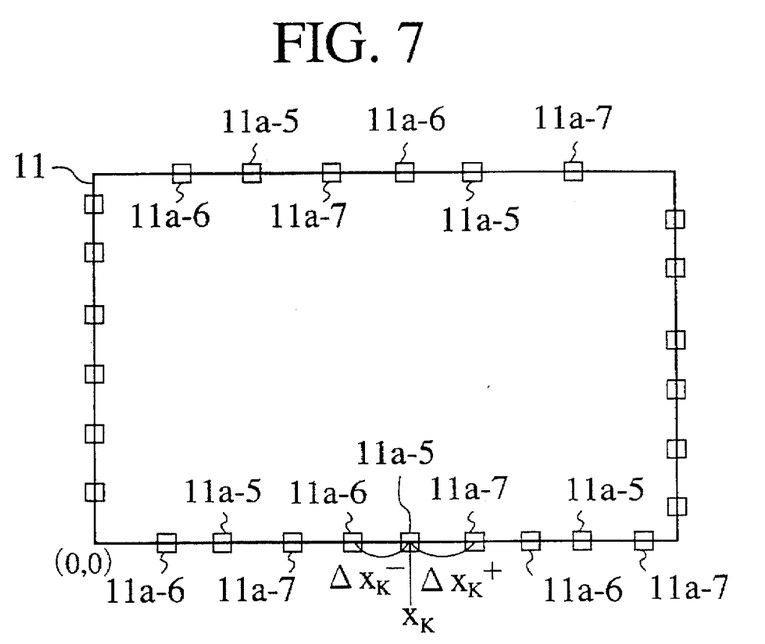
FIG. 7 is a schematic diagram showing a further example of determining the compaction constraint in accordance with the embodiment of the present invention.

Next, a further example of determining the compaction constraint (3) in accordance with the present embodiment of the present invention will be described hereinbelow with reference to FIG. 7.

When the current level cell layout 11 is compacted in the X-direction, the terminals 11a-5 which are (3N–1)-th terminals, where N=1, 2, . . . , from the leftmost terminals of those arranged on the upper and lower sides of the current level cell layout 11 are relocated from the original positions Xk before compaction to new positions Xk' after compaction. In this case, the compaction constraint imposed is expressed by the following formula $$g \cdot Xk \leq Xk' \leq h \cdot Xk.$$

Also, for adjacent terminals to the (3N–1)-th terminals, compaction constraints are given as follows.

$$g \cdot \Delta Xk- \leq \Delta Xk-' \leq h \cdot \Delta Xk-$$

$$g \cdot \Delta Xk+ \leq \Delta Xk+' \leq h \cdot \Delta Xk+$$

where the distance between each (3N–1)-th terminal and the terminal adjacent to the left of the (3N–1)-th terminal varies from the original distance $\Delta$ Xk– before compaction to new distance $\Delta$ Xk–' after compaction, and the distance between each (3N–1)-th terminal and the terminal Adjacent to the right of the (3N–1)-th terminal varies from the original distance $\Delta$ Xk+ before compaction to new distance $\Delta$ Xk+' after compaction.

The actual values "g" and "h" are appropriately selected by a designer in accordance with the case taking into account the compaction ratio in the same manner as in the previous example.

When compaction is performed in the Y-direction, similar compaction constraints are given to the terminals arranged on the right and left sides of the current level cell layout 11.

In the previous example described with reference to FIG. 6, the relationship of adjacent cell layouts is always maintained also in the case where terminals are closely located in original positions. However, when the current level cell layout has a large number of terminals, rightside terminals of those arranged on the upper and lower sides of the current level cell layout 11 may possibly be moved by large distances. This is also the case for upper terminals of those arranged on the right and left sides of the current level cell layout 11. The instant example described with reference to FIG. 7 has been made by combining the advantages of the previous two examples so that the relationship of adjacent cell layouts is always maintained while the positions of the terminals near the upper side and the right side are not so largely moved.

Figure 8:
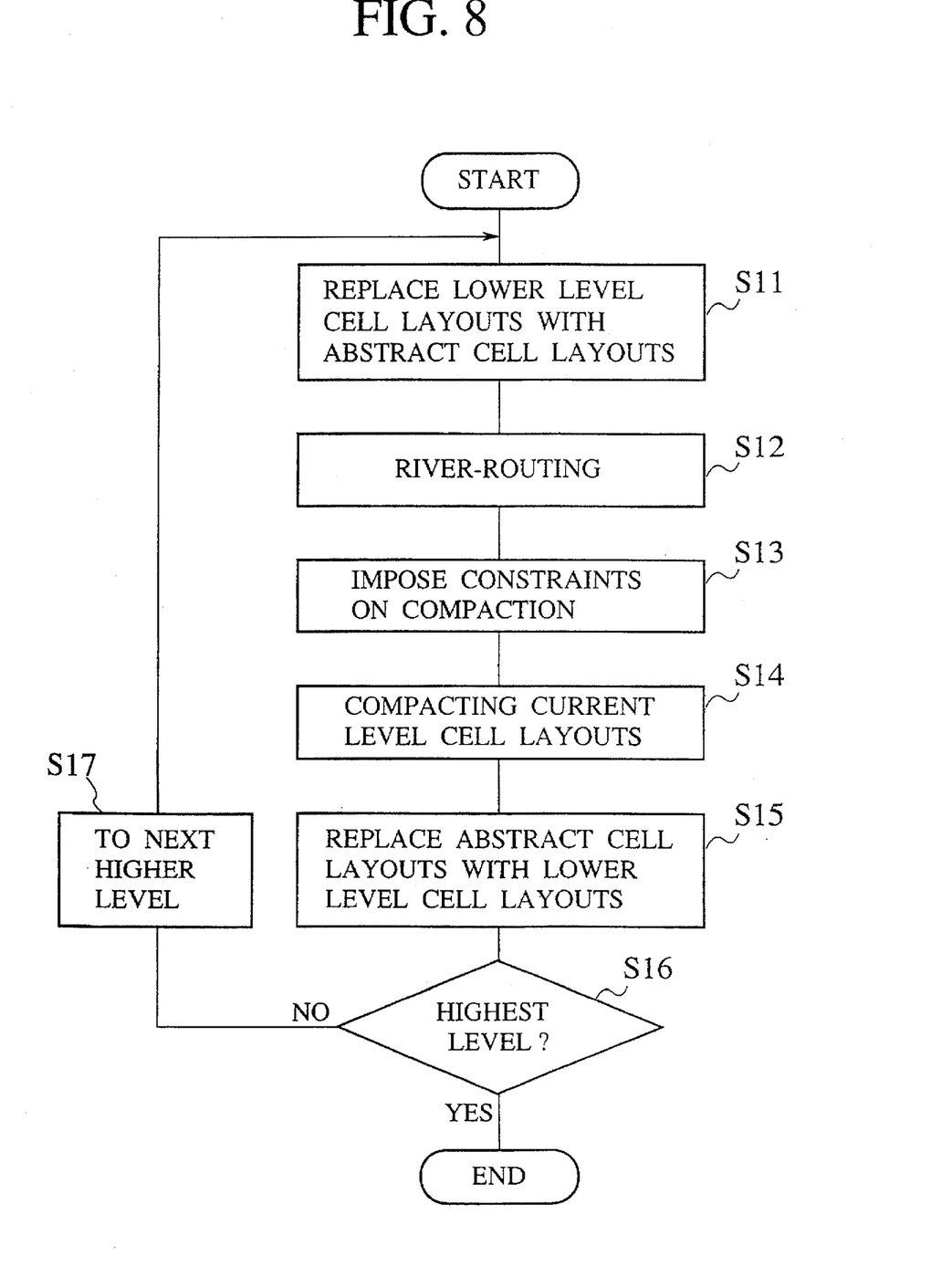
FIG. 8 is a flow chart showing a method of compacting layouts of semiconductor integrated circuit in accordance with another embodiment of the present invention.

Referring now to FIG. 8, a method of compacting layouts of semiconductor integrated circuit in accordance with another embodiment of the present invention will be described. FIG. 8 is a flow chart corresponding to FIG. 1.

Figure 9:
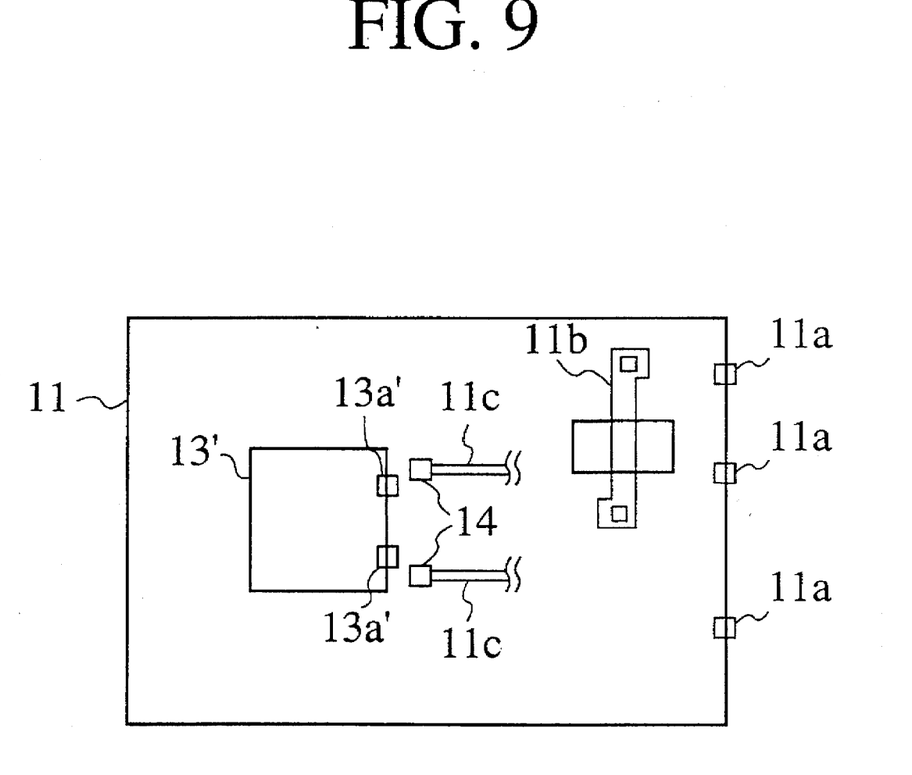
FIG. 9 is a schematic diagram showing the current level cell layout in which a lower level cell layout involved in the current level cell layout is replaced by an abstract cell layout in accordance with the embodiment of the present invention as illustrated in FIG. 8.

First, the lower level cell layout 12 is replaced with an abstract cell layout in the current level cell layout 11 in Step S11. The abstract cell layout is readily introduced to represent the lower level cell layout 12' having been already compacted only with respect to the position of the terminals and the peripheral configuration. of the lower level cell layout 12'. The size of the abstract cell layout 13' can not be changed after compaction while the position of the abstract cell layout 13' can be moved. FIG. 9 is a schematic diagram showing the current level cell layout 11 in which the lower level cell layout 12 is replaced with the abstract cell layout 13'. The terminals 13a' of the abstract cell layout 13' are located apart from the wirings 11c since the abstract cell layout 13' has already been compacted corresponding to the compacted lower level cell 12'. Namely, there are spaces between the terminals 13a' of the abstract cell layout 13' and the positions 14 in which the terminals of the lower level cell layout 12 are located in advance of replacement.

The connection of the terminals 13a' of the abstract cell layout 13' are made in Step S12 by the river-routing technique to the positions 14 of the lower level cell layout 12 already removed. The terminals 13a' of the abstract cell layout 13' are then connected to the wirings 11c. The compaction constraint (3) as explained in the previous embodiment is imposed in Step S13 to a compactor in advance of actual compaction by the compactor. After imposing the compaction constraints to the compactor, the current level cell layout 11 is compacted together with other cell layouts in the same level in Step S14. The layout of the current level cell layout 11 is then completed by replacing the abstract cell layout 13' with the lower level cell layout 12' in Step S15. In Step S16, it is judged whether or not the current level cell layout 11 is a highest level cell layout of the semiconductor integrated circuit. If the current level cell layout 11 is a highest level cell layout, the compaction process is completed. If the current level cell layout 11 is not a highest level cell layout, the processes in Steps S11 to S18 are repeated for cell layouts one level higher than the current level cell layout 11.

The compaction of the layout of a semiconductor integrated circuit designed in a hierarchy can be carried out in order by sequentially performing compaction from the lowest level cell layouts to the highest level cell layouts in accordance with Steps S11 to S15.

As described above, in accordance with the present invention, compaction for each hierarchical level of the layout can be performed with no or limited relocation of the terminals of the respective cell layouts one level lower than the current level cell from the original positions so that there are needed only narrow interconnection areas for making connection between lower level cell layouts and highest level cell layouts.

Also, the method of compacting layouts of semiconductor integrated circuits in accordance with the present invention can be applied to layouts having some regularities between lower level cell layouts and higher level cell layouts so that the applicability is not limited unlike the case of the pitch-mapping method.

The method of compacting layouts of semiconductor integrated circuit in accordance with the present invention is therefore utilized to solve problems which would arise in conventional techniques including the bottom-up method and the pitch-mapping method. The performance of the method in accordance with the present invention can be improved during application by readily modifying the compaction constraints in accordance with the results of actual compaction or on the basis of the technical background.

The foregoing description of preferred embodiments has been presented for purposes of illustration and description. It is not intended to be exhaustive or to limit the invention to the precise form described, and obviously many modifications and variations are possible in light of the above teachings. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A method for performing compaction of a layout of a semiconductor integrated circuit designed in a hierarchy, said layout including cell layouts, each cell layout being designed in one of a plurality of hierarchical levels, said method being capable of performing compaction of said layout of the semiconductor integrated circuit by repeating a single level compaction process for compacting cell layouts in one of said hierarchical levels from a lowest level to a highest level of said hierarchical levels, said single level compaction process comprising:

a first replacement step of replacing lower level cell layouts having been compacted in said single level compaction process in a hierarchical level one level lower than that of a current level cell layout with abstract cell layouts, said abstract cell layouts having the same profile and the same positions of terminals to be connected to said current level cell layout as said lower level cell layouts have in advance of compaction;

a compaction constraint imposition step for imposing compaction constraints on a compactor, said compaction constraints including the following constraints the relocations of the terminals of said current level cell layout after compaction from the original positions before compaction are possible within prescribed ranges, the positions of the terminals and the dimensions of said abstract cell layouts are equal to those of said lower level cell layouts after compaction; and interconnection between the terminals of said abstract cell layouts and said current level cell layout is maintained after compaction;

a compaction step of compacting said current level cell layout using said compactor under said compaction constraints; and a second replacement step of replacing said abstract cell layouts with said lower level cell layouts having been compacted.

2. The method for performing compaction as claimed in claim 1, further comprising a river-routing step of connecting the terminals of said abstract cell layouts with said current level cell layout using single layered wirings when the interconnection between the terminals of said abstract cell layout and said current level cell layouts is not maintained after compaction.

3. A method for performing compaction of a layout of a semiconductor integrated circuit designed in a hierarchy, said layout being composed of cell layouts, each cell layout being designed in one of a plurality of hierarchical levels, said method being capable of performing compaction of said layout of the semiconductor integrated circuit by repeating a single level compaction process for compacting cell layouts in one of said hierarchical levels from a lowest level to a highest level of said hierarchical levels, said single level compaction process comprising:

a first replacement step of replacing lower level cell layouts having been compacted in said single level compaction process in a hierarchical level one level lower than that of a current level cell layout with abstract cell layouts, said abstract cell layouts having the same profile and the same positions of terminals to be connected to said current level cell layout as said lower level cell layouts have after compaction;

a river-routing step of connecting the terminals of said abstract cell layout with said current level cell layout by means of single layered wirings;

a compaction constraint imposition step for imposing compaction constraints on a compactor, said compaction constraints including a constraint that the relocations of the terminals of said current level cell layout after compaction from the original positions before compaction are possible within prescribed ranges:

a compaction step of compacting said current level cell layout by means of said compactor under said compaction constraints; and a second replacement step of replacing said abstract cell layouts with said lower level cell layouts having been compacted.

4. The method for performing compaction as claimed in claim 3, wherein the compaction constraints include a constraint that the positions of the terminals and the dimensions of said abstract cell layouts are equal to those of said lower level cell layouts after compaction, and that the interconnection between the terminals of said abstract cell layouts and said current level cell layout is maintained after compaction.

* * * * *